United States Patent [19]
Atsumi et al.

[11] Patent Number: 4,879,689
[45] Date of Patent: Nov. 7, 1989

[54] NONVOLATILE SEMICONDUCTOR MEMORY DEVICE

[75] Inventors: Shigeru Atsumi; Sumio Tanaka, both of Tokyo; Shinji Saito; Nobauki Otsuka, both of Yokohama, all of Japan

[73] Assignee: Kabushiki Kaisha Toshiba, Kawasaki, Japan

[21] Appl. No.: 30,065

[22] Filed: Mar. 25, 1987

[30] Foreign Application Priority Data

Mar. 31, 1986 [JP] Japan .................................. 61-71139

[51] Int. Cl.$^4$ ........................ G11C 11/40; G11C 29/00
[52] U.S. Cl. .................................... 365/201; 365/185;
365/189.05; 365/195
[58] Field of Search ............... 365/104, 189, 210, 195, 365/201

[56] References Cited
U.S. PATENT DOCUMENTS

| | | | |
|---|---|---|---|
| 4,404,659 | 9/1983 | Kihara et al. | 365/189 |
| 4,451,903 | 5/1984 | Jordan | 365/94 |
| 4,758,984 | 7/1988 | Yoshida | 365/104 |

Primary Examiner—James W. Moffitt
Attorney, Agent, or Firm—Finnegan, Henderson, Farabow, Garrett, and Dunner

[57] ABSTRACT

A nonvolatile semiconductor memory device comprising a matrix array of memory cells, word lines for driving the rows of memory cells, bit lines for reading data from columns of memory cells, a plurality of first MOS transistors provided for these bit lines, respectively, a second MOS transistor having a source coupled to the bit lines by the first MOS transistors, a drain coupled to a VCC terminal, and a gate connected to receive a predetermined bias voltage, a row decoder for selecting one of the word lines in accordance with a row-address signal, and a column decoder for turning on one of the first MOS transistors in accordance with a column-address signal. The memory device further has a $\overline{CE}$ terminal for receiving a test-mode signal, an $\overline{OE}$ terminal for receiving first and second control signals, and a control circuit for detecting a test mode, thereby prohibiting the operation of the row decoder in response to the first control signal, and permitting the operation of the row decoder in response to the second control signal.

12 Claims, 6 Drawing Sheets

NONVOLATILE SEMICONDUCTOR MEMORY DEVICE

BACKGROUND OF THE INVENTION

The present invention relates to a nonvolatile semiconductor memory device, and more particularly, to a nonvolatile semiconductor memory device which has a memory chip sealed with resin material permitting no passage of ultraviolet rays, and into which desired data can be written only once.

An EPROM is well known as a nonvolatile semiconductor memory device of the type in which data can be erased by ultraviolet rays and new data can then be written. The EPROM comprises a ceramic package having a glass window, and a semiconductor memory chip sealed within the package. In order to erase data in the memory chip, ultraviolet rays are applied to the chip through the glass window. In order to write new data into the memory chip, electric signals are supplied to the package pins connected to the memory chip.

Recently the demand for one-time programmable read-only memories (or OTPROMs) has been increasing in the market of nonvolatile semiconductor memory devices. An OTPROM is characterized in that a semiconductor memory chip, which is similar to one used in the EPROM, is sealed within a plastic package without a glass window. Since ultraviolet rays cannot be applied to the memory chip, the data stored in the chip cannot be erased. Nor can new data be written into the memory chip. In other words, data can be written only once into the chip. Nonetheless, an OTPROM is advantageous over an EPROM. It can be manufactured at lower cost since the plastic package is less expensive than the ceramic package having a glass window.

A market search has shown that about 80% of all EPROMs used thus far have never undergone a data-rewriting process. It would obviously better to replace as many EPROMs as possible with less expensive OTPROMs. In view of this, it can be predicted that OTPROMs will be dominantly used in the future.

However, the OTPROMs hitherto known have a drawback. Once an OTPROM has been completed, it is no longer possible to write data into the memory cells of the OTPROM. Hence, any test data cannot be written in the cells in order to check the reliability of the OTPROM. One of the important tests that must be performed on OTPROMs is to determine the address access time, i.e., the time which has elapsed from the addressing of any memory cell until the data-transfer onto the data output line to which the cell is coupled. In order to measure the memory access time of the OTPROM, test data must be stored into memory cells, Since no data can be written in the memory cells after the OTPROM has been completed, the memory access time cannot be determined at all.

The memory cells of an EPROM, and the method of measuring the address access time of an EPROM will be explained to facilitate the understanding of the present invention.

An EPROM has memory cells arranged in rows and columns. Each of these memory cells comprises an n-channel, floating gate MOS transistor. FIG. 1 is a schematical, cross-sectional view of this MOS transistor. As is shown in FIG. 1, the MOS transistor comprises n+-type source region 10 and n+-type drain region 12, both formed in the surface region of p-type semiconductor substrate 14. That surface portion of substrate 14 which is located between source region 10 and drain region 12 serves as channel region 14A. Insulation film 18 is formed mainly on this channel region 14A and partly on source region 10 and drain region 12. Floating gate 16 is formed on insulation film 18. Insulation film 22 is formed on floating gate 16. Control gate 20 is formed on insulation film 22. Source region 10 and substrate 14 are connected to a power terminal at ground potential of, for example, 0 volt.

Each memory cell of the EPROM stores data corresponding to the electric charge within the floating gate 16 of the MOS transistor shown in FIG. 1. More specifically, the memory cell stores data "1" when floating gate 16 is discharged, and stores data "0" when floating gate 16 is charged. The EPROM is delivered from the factory, with its all memory cells storing data "1". In other words, the floating gates 16 of all memory cells are in discharged state when the EPROM is delivered from the manufacturer to the user. The user selects some of the memory cells, and writes data "0" into the selected memory cells, thus programming the EPROM.

The programming of the EPROM is performed in the following way. A programming voltage VPP (e.g., 12.5 V) is applied through the power source pin of the EPROM package to a data-writing circuit provided within the EPROM. Then, the data-writing circuit sets drain region 12 and control gate 20 of each selected memory cell at high potential of, for example, 8 V and 12.5 V, respectively. A current thereby flows through the current path of the MOS transistor forming the selected memory cell. Subsequently, hot electrons are generated within that portion of channel region 14A which is adjacent to drain region 12. These hot electrons are accelerated by the electric field extending between control gate 20 and substrate 14, and are injected into floating gate 16. As a result, floating gate 16 discharged, and its potential falls. The threshold voltage VTH of the MOS transistor therefore rises. More precisely, threshold voltage VTH is changed from a first predetermined level (e.g., 2 V), which is lower than power source voltage VCC (e.g., 5 V), to a second predetermined level (e.g., 5 V) equal or higher than power source voltage VCC.

To read data from the EPROM, power source voltage VCC is applied to the power source pin of the EPROM package, whereby the drain region 12 and control gate 20 of each selected memory cell are set to the potential equal to power source voltage VCC. The logic value of the data stored in the selected memory cell is detected from the change in the drain voltage, which has been caused by the current flowing through the current path of the MOS transistor. When threshold voltage VTH is at the first predetermined level, the MOS transistor is turned on, whereby data "1" is read from the memory cell. Conversely, when threshold voltage VTH is at the second predetermined level, the MOS transistor is turned off, whereby data "0" is read from the memory cell.

The change $\Delta$VTH of threshold voltage VTH cell depends on the charging period TPW (or programming pulse width) of floating gate 16. The relationship between $\Delta$VTH and cell log (TPW) is shown in FIG. 2. As is evident from FIG. 2, the longer the charging period TPW, the greater the change $\Delta$VTH cell.

The EPROM is programmed by intelligent program method, as is commonly practiced. In this program method, a programming voltage VPP is applied to the package pin of the EPROM, in the form of a pulse having a prescribed duration, thereby charging the floating gate 16 of each selected memory cell to such extent that data "0" can be read from the memory cell. When it is ascertained that floating gate 16 has been charged to this extent, an additional pulse of voltage VPP is supplied to the package pin, thus further charging floating gate 16. Hence, data "0" can be more reliably read from the selected memory cell.

A so-called "checker pattern" is used to measure the address access time of the EPROM. The checker pattern is data consisting of "1" bits and "0" bits alternately stored in the memory cells of each row, and "1" bits and "0" bits alternately stored in the memory cells of each column. In other words, when data "1" is stored in memory cell M(i,j) of the ith row and the jth column (i=2, 4, 6, 8 . . . ; j=2, 4, 6, 8 . . . ), data "0" is stored memory cells M(i, j−1), M(i, j+1), M(i−1, j), and M(i+1, j). The address access time is measured after this checker pattern has been preset in the memory cell array. Data "1" or data "0" is read through alternate data lines as all memory cells are sequentially designated. The period which the potential of each data line requires to change completely. The checker pattern is used to read "1" data and "0" data by turns since the potential of each data line must change when the data being read out through the data line falls from "1" level to "0" level, or rises from "0" level to "1" level.

SUMMARY OF THE INVENTION

The object of the present invention is to provide a nonvolatile semiconductor memory device into which test data need not be written in order to measure its address access time.

According to this invention, there is provided a nonvolatile semiconductor memory device comprising a plurality of memory cells arranged in rows and columns; a plurality of word lines for driving the rows of memory cells; a plurality of bit lines for reading data from the columns of memory cells; a plurality of switching sections provided for the bit lines, respectively; a load circuit having a first end connected to the bit lines by the switching sections, and a second end connected to a power source terminal; a first selecting circuit for selecting one of the word lines in accordance with an address signal; a second selecting circuit for turning on one of the switching sections in accordance with the address signal; a first terminal for receiving a test-mode signal; a second terminal for receiving a control signal at first and second levels; and control circuit for detecting a test mode, thereby prohibiting the operation of the first selecting circuit in response to the control signal at the first level, and permitting the operation of the first selecting circuit in response to the control signal at the second level.

The nonvolatile semiconductor memory device according to the present invention makes it possible to measure its address access time during the inspection which the device must undergo when it is a packaged OTPROM, without presetting test data in its memory cells.

When data "1" is read from one of the unprogrammed memory cells of the memory device set in test mode, the bit line, to which the unprogrammed memory cell is coupled, can be pre-charged. The bit line can, therefore, be set at a potential equivalent to data "0" before the unprogrammed memory cell is driven. Hence, test data need not be preset in the memory cells in order to measure the address access time of the memory device. In addition, the time at which the control signal is changed from first level to the second level can be utilized as the reference for the timing of measuring the address access time of the memory device.

DETAILED DESCRIPTION OF THE PREFERRED EMBODIMENTS

Generally, in the reliability test of nonvolatile semiconductor memories, the address access time is measured of every cell of the memory. According to the worst address access time measured, it is determined whether or not the memory passes the defect inspection. The address access time of each memory cell depends of the various characteristics of the cell. It takes one value when measured while data "1" is being read from the cell, and assumes another value when measured while data "0" is being read from the cell.

While data "1" is being read from any selected memory cell, the cell current flows in the floating gate MOS transistor of the cell. The amount of current influences the address access time. That is, the larger the cell current, the shorter the address access time. In some cells, a cell current smaller than the rated value of the memory cells flows, due to a fluctuation of the manufacture process. These memory cells will most likely have the longest access time.

In reading data "0" from a memory cell, the address access time of the cell greatly depends on the charging condition of the floating gate MOS transistor of the cell, i.e., the change $\Delta VTH$ of the threshold voltage $VTH$ of this MOS transistor. Unless the change $\Delta VTH$ is sufficiently large, the MOS transistor cannot be rendered nonconductive, and the cell current will unreliably flow through the MOS transistor. As long as the cell current is relatively small, nothing worse than an increase of access time will occur. When the cell current is extremely large, however, there is the possibility that the data "0" be sensed as data "1".

The longer the MOS transistor of a memory is charged, the more reliably the data "0" can be stored in the memory cell. When the intelligent programming method is employed in order to store data "0" into a desired memory cell, the MOS transistor of this cell can have a threshold voltage much higher than the rated threshold voltage VTH cell over which the data "0" can be sensed. It is therefore well expected that the cell can stably operate in response to a suppressed cell current and can maintain a short access time while the data "0" is being read out of it. Hence, it suffices to measure address access time for only those cells which store data "1" and which must therefore be rendered conductive when selected.

Figure 1:
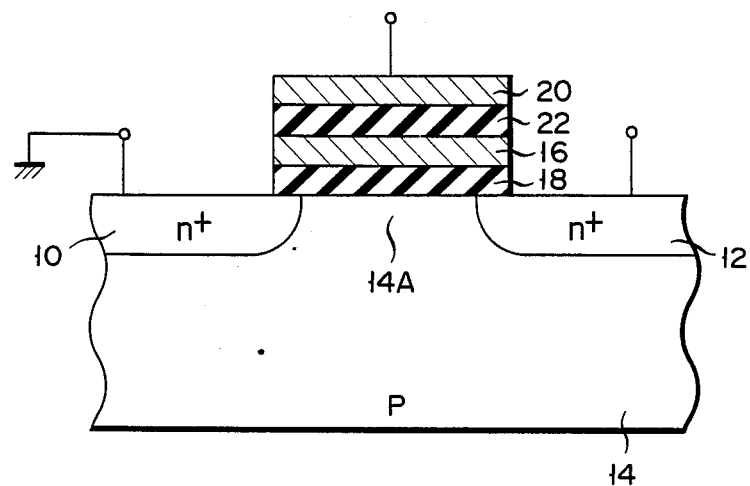
FIG. 1 is a cross-sectional view of a floating gate, MOS transistor used as a memory cell of a conventional EPROM.
Figure 2:
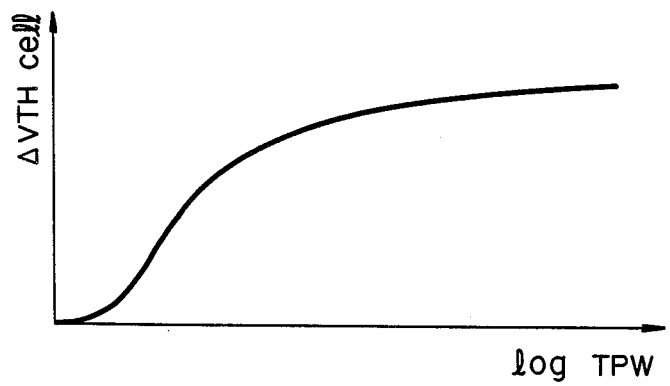
FIG. 2 is a graph illustrating the relationship between the charging period of the floating gate shown in FIG. 1, on the one hand, and the changes of the threshold voltage of the MOS transistor shown in FIG. 1, on the other.
Figure 3:
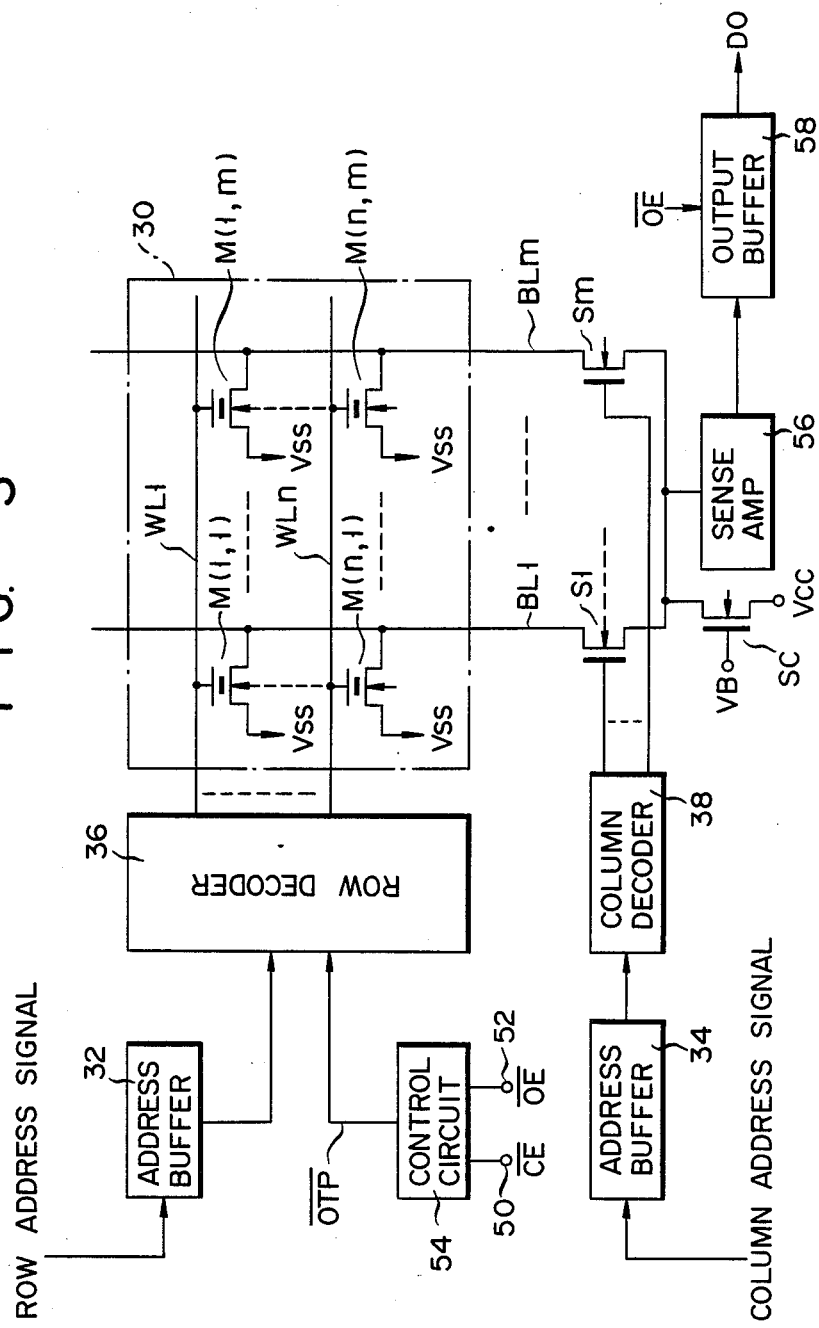
FIG. 3 is a block diagram showing the circuit configuration of a nonvolatile semiconductor memory device according to the present invention.

For the above reasons, OTPROMs can be readily and reliably inspected by measuring address access time for only those memory cells storing data "1" after the chips of the OTPROMs have been packaged. FIG. 3 shows a nonvolatile semiconductor memory device according to the invention, which can be tested for its reliability by this specific method.

The nonvolatile semiconductor memory device shown in FIG. 3 is provided in the form of a semiconductor memory chip, molded with a plastic resin which permits no passage of ultraviolet rays. Hence, this memory device can be used as an OTPROM. It has package pins for selectively receiving a programming voltage VPP (e.g., 12.5 V) and a power source voltage VCC (e.g., 5 V). It also has package pins for receiving an address signal AR, and package pins for receiving a chip enable signal $\overline{CE}$, an output enable signal $\overline{OE}$ and the like, respectively. The nonvolatile semiconductor memory device is provided with a data-programming circuit and a voltage divider circuit. Both the data-programming circuit and the voltage divider circuit are of the known type, and neither is therefore illustrated in FIG. 3. Programming voltage VPP and power source voltage VCC are applied to the voltage divider circuit through the common package pins of the memory device (OTPROM). Power terminals VCC and VSS, both shown in FIG. 3, are the output terminals of this voltage divider circuit, and are set at potentials of 5 V and 0 V, respectively.

Chip enable signal $\overline{CE}$ is supplied to the nonvolatile semiconductor memory device to set the device in one of two operating modes, i.e., normal mode and test mode. Signal $\overline{CE}$ can be set at voltage levels of 0 V, 5 V and 12.5 V. When the voltage level of signal is 0 V or 5 V, the memory device is set in the normal mode. When the voltage level of signal $\overline{CE}$ is 12.5 V, the device is set in the test mode. Output enable signal $\overline{OE}$ allows the memory device to output data. More precisely, when the voltage level of output enable signal $\overline{OE}$ falls from 5 V to 0 V, the memory device is enabled to output the data. In the defect inspection, the device is set in the test mode under the control of an external device, the data output is allowed upon lapse of a predetermined period from the updating of address signal AR. The period between the fall of signal $\overline{OE}$ and the confirmation of the output data is measured as an address access time of the memory device.

As is shown in FIG. 3, the nonvolatile semiconductor memory device has matrix array 30 of memory cells M(1,1) to M(n,m). The memory cells each comprise an n-channel floating gate MOS transistor, and are arranged in n rows and m columns. Word lines WL1 to WLn are provided parallel to the n rows of cells. Memory cells M(1,1) to M(1,m) forming one row are coupled to word line WL1; memory cells M(2,1) to M(2,m) forming another row are connected to word line WL2; and memory cells M(n,1) to M(n,m) forming the last row are connected to word line WLn. Similarly, the memory cells forming the other rows are coupled to word lines WL3 to WL(n−1). Bit lines BL1 to BLm are provided parallel to m columns of cells. Memory cells M(1,1) to M(n,1) forming the first column are coupled to bit line BL1; memory cells M(1,2) to M(n,2) forming the second column are connected to bit line BL2; and memory cells M(1,m) to M(n,m) forming the last column are coupled to last bit line BLm. The memory cells forming the other columns are connected to bit lines BL3 to BL(m−1). The floating gate MOS transistor of each memory cell has a control gate coupled to the corresponding word line, a drain coupled to the corresponding bit line, and a source connected to power terminal VSS.

The memory device has n-channel MOS transistor SC which is used as a load circuit for bit lines BL1 to BLm. Bias voltage VB (e.g., 3 V) is applied to the gate of this MOS transistor SC. The current path of MOS transistor SC is connected at one end to power terminal VCC. The device also has n-channel MOS transistors S1 to Sm which constitute a switching circuit. MOS transistors S1 to Sm are connected at one end to bit lines BL1 to BLm, respectively, and are coupled at the other end to the other end of the current path of MOS transistor SC.

The memory device further comprises row address buffer 32, column address buffer 34, row decoder 36, and column decoder 38. Address signal AR is divided into a row address signal and a column address signal using conventional techniques, such as, using the high order bits of address signal AR as the row address signal and the low order bits of address signal AR as the column address signal. The row address signal and the column address signal are supplied to row address buffer 32 and column address buffer 34, respectively, through the package pins of the memory device. In response to the row address signal, row address buffer 32 produces two output signals, one having the same phase as the row address signal, and the other having the phase opposite to that of the row address signal. These output signals of row address buffer 32 are supplied to row decoder 36. In response to the output signals of row address buffer 32, row decoder 36 drives one of word lines WL1 to WLm. In response to the column address signal, column address buffer 34 generates two signals, one having the same phase as the column address signal, and the other having the phase opposite to that of the column address signal. These output signals of column address buffer 34 are input to column decoder 38. In response to the output signals of column address buffer 34, column decoder 38 drives one of MOS transistors S1 to Sm, thereby turning this MOS transistor on.

As is shown in FIG. 3, the memory device has chip enable terminal 50, output enable terminal 52, and control circuit 54. Terminals 50 and 52 are coupled to control circuit 54. Chip enable signal $\overline{CE}$ is supplied to terminal 50 from one package pin, and output enable signal $\overline{OE}$ is supplied to terminal 52 from another package pin. Control circuit 54 detects the normal mode or the test mode, in accordance with the potential of chip enable terminal 50. When control circuit 54 detects the test mode, it controls row decoder 36 in accordance with the potential of output enable terminal 52. More specifically, control circuit 54 prohibits row decoder 36 from operating, as long as the potential of terminal 52 remains at the VCC level (=5 V); it allows row decoder 36 to operate, when output enable signal $\overline{OE}$ falls from the VCC level to the VSS level (=0 V). On the other hand, when control circuit 54 detects the normal mode, it allows row decoder 36 to operate, regardless of the level of output enable signal $\overline{OE}$.

The memory device further comprises sense amplifier 56 and output buffer 58. Sense amplifier 56 detects the data read from any memory cell. Output buffer 58 temporarily stores the data detected by sense amplifier 56. Sense amplifier 56 is coupled to bit lines BL1 to BLm by the current paths of MOS transistors S1 to Sm, thereby to amplify the potential on any selected bit line. Output buffer 58 outputs the data under the control of output enable signal $\overline{OE}$.

Chip enable signal $\overline{CE}$ can be used to control sense amplifier 56, in order to reduce the current consumed while all memory device remains in a stand-by state.

Figure 4:
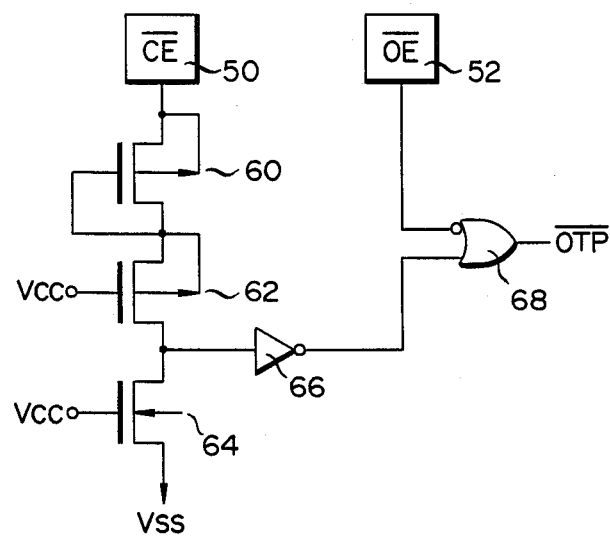
FIG. 4 is a circuit diagram of the control circuit shown in FIG. 3.

FIG. 4 shows control circuit 54 in greater detail. As is shown in this figure, circuit 54 comprises two p-channel MOS transistors 60 and 62, one n-channel MOS transistor 64, one inverter 66, and one OR gate 68. The current paths of MOS transistors 60, 62, and 64 are connected in series between chip enable terminal 50 and power terminal VSS. The gate of MOS transistor 60 is coupled to the junction of MOS transistors 60 and 62. Power source voltage VCC is applied to the gates of MOS transistors 62 and 64. The junction of the current paths of MOS transistors 62 and 64 is coupled to the input terminal of inverter 66. The output signal of this inverter 66 is supplied to the first input terminal of OR gate 68. The inverted input terminal of OR gate 68 is connected to output enable terminal 52. OR gate 68 outputs a control signal $\overline{OTP}$ in accordance with its two input signals.

When the potential of chip enable terminal 50 is lower than VCC+2VTHp, where VTHp is the threshold voltage of p-channel MOS transistors 60 and 62, MOS transistors 62 and 64 remain nonconductive and conductive, respectively, as long as their gate voltage is at the VCC level (=5 V). Threshold voltage VTHp is approximately 1 V. As long as MOS transistor 64 remains conductive, it electrically connects the input terminal of inverter 66 to power terminal VSS. When the potential of chip enable terminal 50 is equal to VCC+2 VTHp or more, MOS transistors 60 and 62 are turned on. In this case, the input terminal of inverter 66 is set at the potential determined by the voltage ratio between MOS transistors 60 and 62, on the one hand, and MOS transistor 64, on the other. This potential is selected to be higher than the threshold voltage of inverter 66. In response an input voltage higher than this threshold voltage, inverter 66 generates an output signal at high level (=5 V).

When chip enable terminal 50 is set at the potential of 12.5 V, thus setting the memory device in the test mode, inverter 66 generates an output signal at the low level, which represents the test mode. OR gate 68 produces an output signal which is the logic sum of the output signal supplied from inverter 66 and the output enable signal $\overline{OE}$ supplied from terminal 52.

The potential at output enable terminal 52 is held at the high level (=5 V) until output enable signal $\overline{OE}$ is supplied to output buffer 58. When signal $\overline{OE}$ is supplied to buffer 58, the potential at terminal 52 falls from the high level (=5 V) to the low level (=0 V). In the normal mode, the output signal of inverter 66 dominantly controls OR gate 68, and the output signal of OR gate 68 is therefore held at the high level, irrespective of the logic value of output enable signal $\overline{OE}$ supplied from terminal 52. In the test mode, the output signal of inverter 66 is not dominant, and the output signal of OR gate 68 changes in accordance with the potential at output enable terminal 52. The potential at terminal 52 is held at the high level (=5 V) until output enable signal $\overline{OE}$ is supplied to output buffer 58. When signal $\overline{OE}$ is supplied to buffer 58, the potential at terminal 52 falls from the high level (=5 V) to the low level (=0 V). As been described above, the output signal of OR gate 68 is used as control signal $\overline{OTP}$ for controlling row decoder 36. Row decoder 36 remains inoperative as long as control signal $\overline{OTP}$ is at the low level, and can operate as long as signal $\overline{OTP}$ is at the high level.

Figure 5:
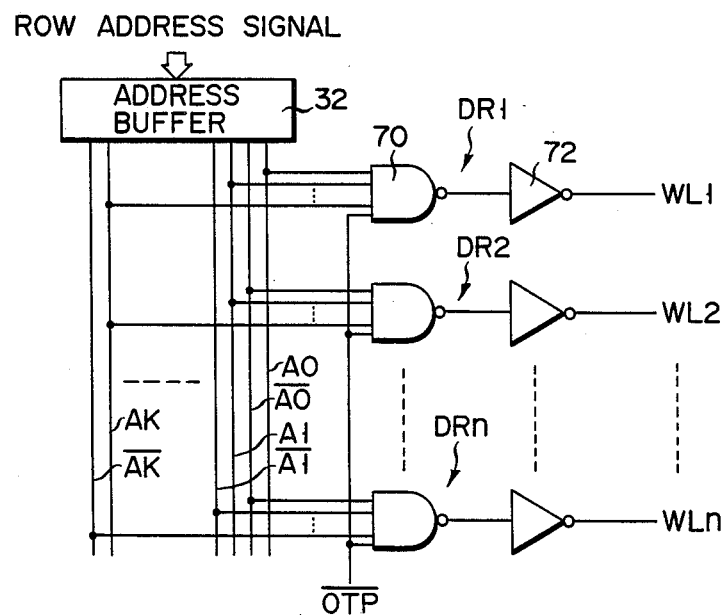
FIG. 5 is a detailed circuit diagram of the row decoder shown in FIG. 3.

FIG. 5 shows row decoder 36 in detail. As is shown in this figure, row decoder 36 has driving units DR1 to DRn provided for word lines WL1 to WLn, respectively. Each of these driving units DR1 to DRn is responsive to a specific row address signal supplied from row address buffer 32, thereby to drive the corresponding word line. Each driving unit has NAND gate 70 and inverter 72 coupled to the output of NAND gate 70.

NAND gate 70 has a plurality of input terminals connected to row address buffer 32 to receive a row address signal therefrom. It has another input terminal coupled to OR gate 68 to receive control signal $\overline{OTP}$ therefrom. Inverter 72 inverts the output signal of NAND gate 70, and supplies an output signal at high or low level to the corresponding word line. A drive voltage of 12.5 V is used as the output signal at high level in the data programming. A drive voltage of 5 V is used as the output signal at high level in the data reading.

It will now explained how data is read from the nonvolatile semiconductor memory device.

When this memory device is completed as an OTPROM, all memory cells M(1,1) to M(n,m) have their floating gates discharged, and each, therefore, stores data "1". The user performs programming on the memory device, thereby writing desired information into the memory device. In order to read the information from the memory device, the device is set in the normal mode.

Figure 6:
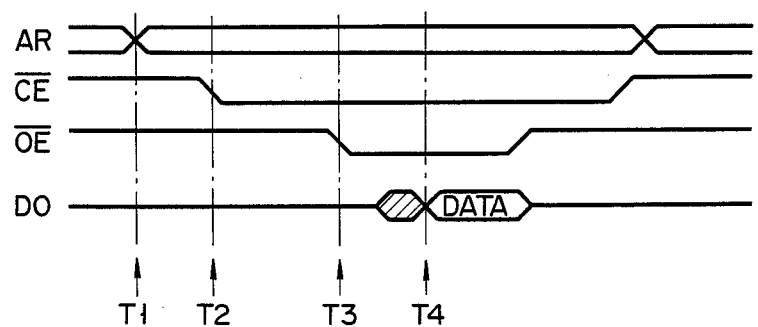
FIG. 6 is a timing chart explaining the operation of the memory device of FIG. 3 set in normal mode.

FIG. 6 is a timing chart explaining how the data is read from the nonvolatile semiconductor memory device when the device is set in the normal mode. At time T1, address signal AR is updated. Thereafter, at time T2, chip enable signal $\overline{CE}$ falls from 5 V to 0 V. At this time, control circuit 54 allows row decoder 36 to operate. The data is therefore read from the memory cell designated by address signal AR to the bit line to which this cell is coupled. Sense amplifier 56 detects this data. At time T3, output enable signal $\overline{OE}$ falls to the low level. Output buffer 58 supplies the data as output data DO to an external device at time T4, upon lapse of the ineffective time indicated by a shaded hexagon in FIG. 6.

Figure 7:
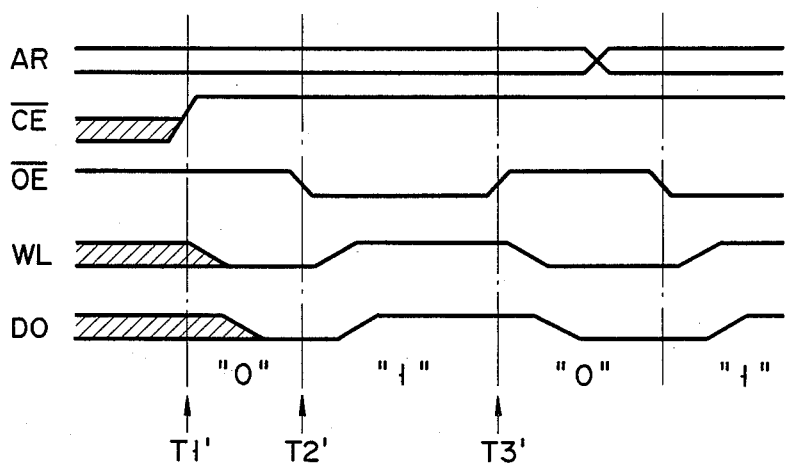
FIG. 7 is a timing chart showing the operation of the memory device of FIG. 3 set in test mode.
Figure 8:
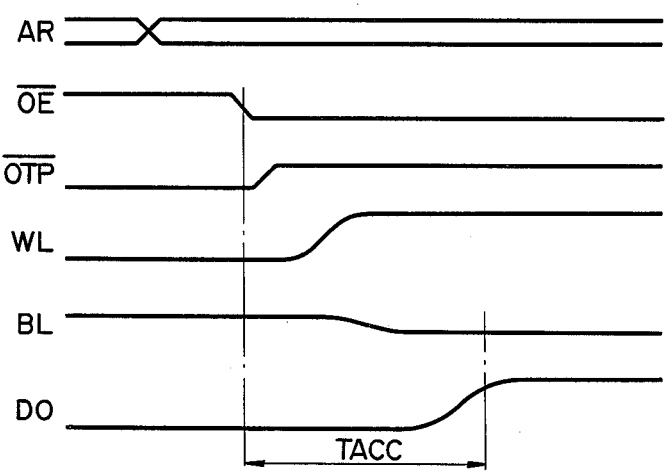
FIG. 8 is a diagram explaining the address access time of the nonvolatile semiconductor memory device shown in FIG. 3.

The nonvolatile semiconductor memory device is set in the test mode in order to measure the address access time of the memory device. FIG. 7 is a timing chart illustrating how the data is read from a selected memory cell in order to determine the access time of this cell. First, address signal AR designating the desired cell is supplied to the memory device. Chip enable signal is set at a high potential of, for example, 12.5 V at time T1'. Output enable signal $\overline{OE}$ is held at the high level (=5 V). While signal $\overline{OE}$ remains at the high level, control circuit 54 continues to generate control signal $\overline{OTP}$ at the low level (=0 V), thus inhibiting drive units DR1 to DRn of row decoder 36 from selecting word lines WL1 to WLn. On the other hand, column decoder 38 is not inhibited from selecting the bit lines. Hence, one of bit lines BL1 to BLm is charged through the corresponding one of MOS transistors S1 to Sm. As a result, data "0" is provided on this bit line. Sense amplifier 56 senses this data "0+, and output buffer 58 holds this data "0". Then, at time T2', output enable signal $\overline{OE}$ falls from the high level (=5 V) to the low level (=0 V). In response to this rise of signal $\overline{OE}$, control circuit 54 enables drive units DR1 to DRn to select the word lines. One of drive units DR1 to DRn thereby drives the corresponding word line, whereby the memory cells of the row selected by row decoder 36 discharge bit lines BL1 to BLm. Sense amplifier 56 detects data "1" from the potential change of the bit line coupled to the cells of the column selected by column decoder 38. Output buffer 58 outputs the data "1" detected by sense amplifier 56. As is shown in FIG. 8, access time TACC is the period between the time signal $\overline{OE}$ falls to the low level and the time data DO is completely changed to "0" level. After data DO has been completely changed, output enable signal $\overline{OE}$ rises to the high level at time T3'. Address signal AR is thereafter updated. The access time TACC of any other memory cell of the memory device is measured thereafter, by repeatedly updating address signal AR.

In reading data "1" from any memory cell, the access time TACC of this cell is, generally, the sum of the time delays occurring in a row-address buffer, a row decoder, a word line, a bit line, a sense amplifier, and an output buffer. The access time measured in the present embodiment by the above method is, strictly speaking, not a sum of such time delays. Nonetheless, this access time, i.e., the period between the change of output enable signal OE and the outputting of data "1", can be used to determine whether the memory device is defective or not. This is because: (i) the time delay in control circuit 54 is substantial equal to the delay time in an ordinary row-address decoder; and (ii) the time delays in the word line and bit line, both being significant factors of address access time TACC, are considered in measuring access time TACC.

The nonvolatile semiconductor memory device according to the invention can be used as an OTPROM into which data cannot be written twice or more times. Nevertheless, the address access time of the memory device can be measured even after desired data has been written into the device. This is because no test data needs to be written in the memory cells in order to measure the address access time. Hence, defect inspection can be readily and reliably accomplished on the memory device of the present invention.

Figure 9:
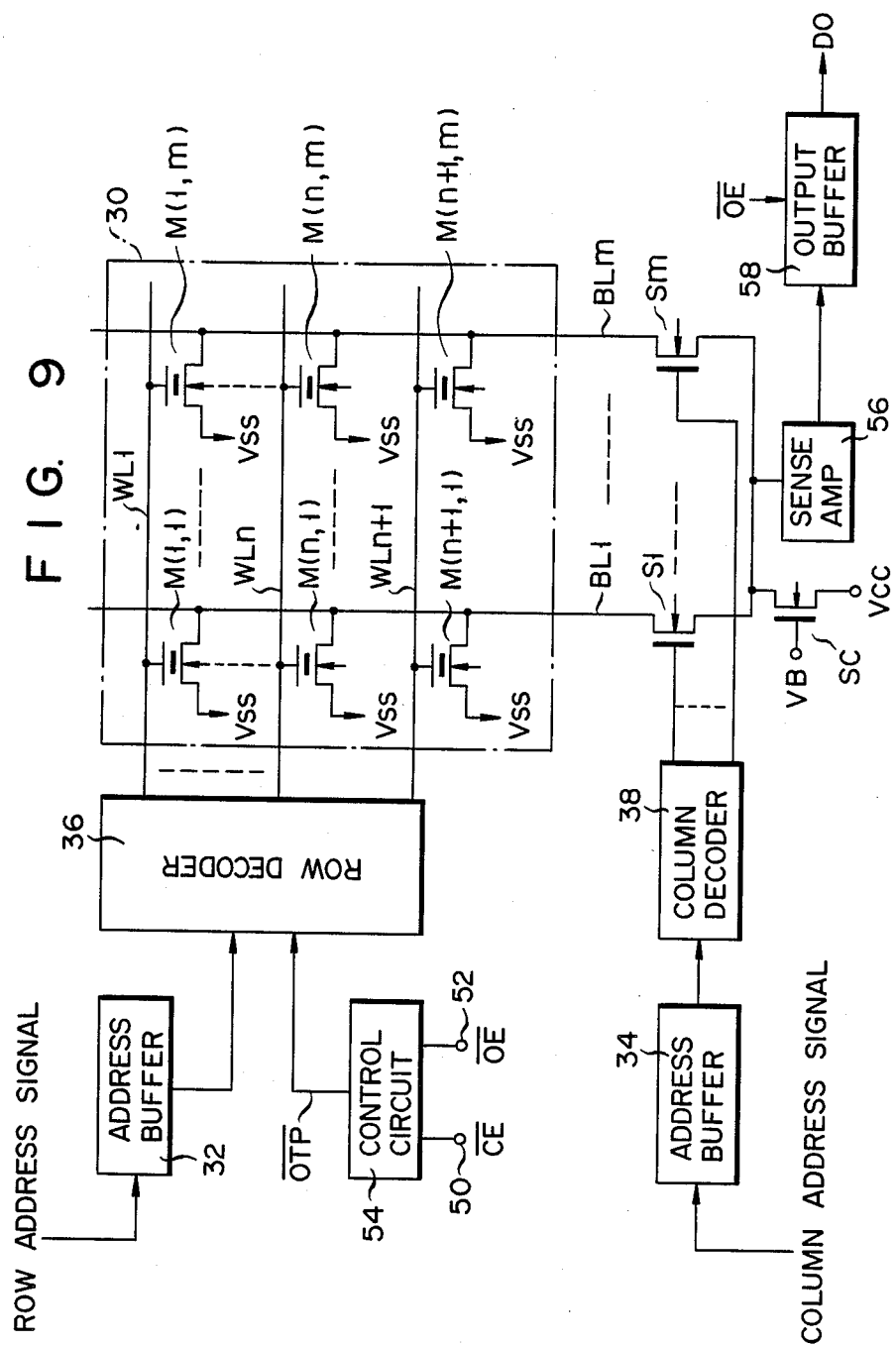
FIG. 9 shows another nonvolatile semiconductor memory device according to the present invention, which has dummy memory cells.

The present invention is not limited to the embodiment described above. Various alterations and modifications can be made without departing the spirit and scope of the invention. In the above embodiment, all word lines are maintained unselected, so that a condition is provided which is equivalent to reading the stored data from the memory cell rendered nonconducting. Instead, as is shown in FIG. 9, dummy word line WLN+1can be provided in addition to word lines WL1 to WLn, and dummy cells M(n+1, 1) to M(n+1, m) storing data "0" can be connected to the intersections of this dummy word line, on the one hand, and bit lines BL1 to BLm. In the memory device of FIG. 9, when word lines WL1 to WLn remain unselected, dummy word line WLn+1is driven, thereby reading the stored data "0" from dummy cells M(n+1, 1) to M(n+1, m). In this case, it is possible to measure the address access time which involves a time delay similar to that occuring in the practical word-line selection.

Figure 10:
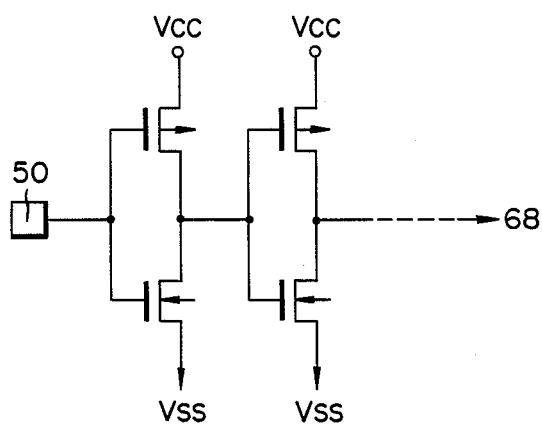
FIGS. 10 and 11 show two modifications of the control circuit used in the memory device of FIG. 3 or in the memory device of FIG. 9.
Figure 11:
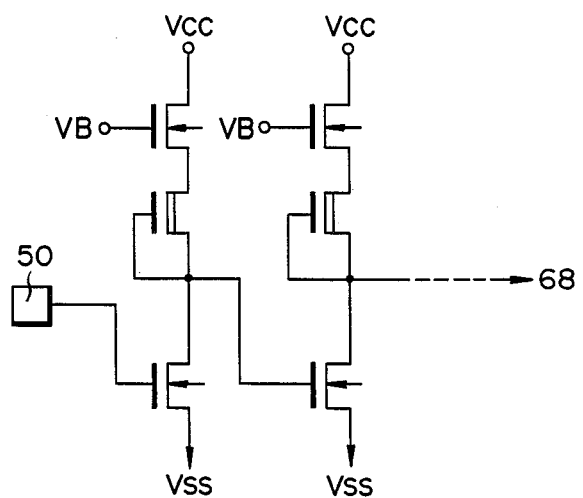

MOS transistors 60, 62 and 64 and inverter 66, all shown in FIG. 4, can be replaced by the ratio circuit shown in FIG. 10 or by the ratio circuit shown in FIG. 11. Either ratio circuit can detect the test mode.

The ratio circuit of FIG. 10 has series inverters formed of CMOS transistors. The threshold voltage of the initial inverter is set at a higher level than the succeeding one.

The ratio circuit of FIG. 11 is similar to that shown in FIG. 10, except that the series inverters are formed of n-channel MOS transistors.

What is claimed is:

1. A nonvolatile semiconductor memory device comprising:
   a memory cell array including a plurality of memory cells which are each formed of a nonvolatile transistor;
   a plurality of word lines each connected to the memory cells in the same row;
   a plurality of bit lines each connected to the memory cells in the same column;
   first selecting means connected to receive an address signal for selecting one of said word lines in accordance with said address signal and driving the memory cells connected to the selected word line;
   second selecting means connected to receive said address signal for selecting one of said bit lines in accordance with said address signal and supplying a predetermined voltage to the selected bit line;
   output means connected to said bit lines for supplying output data corresponding to the potential of the selected bit line;
   a control terminal for receiving a control signal of first and second levels; and
   control means coupled to said control terminal for generating a selection control signal prohibiting the selecting operation of said first selecting means in response to the control signal of said first level and permitting the selecting operation in response to the control signal of said second level, said second selecting means being capable of selecting said one of said bit lines at times when said selection control signal is generated.

2. A nonvolatile semiconductor memory device according to claim 1, wherein said control terminal is an output enable terminal which is kept at a potential of said first level for a predetermined period from the renewal of said address signal and changed from said first level to said second level when said predetermined period is elapsed.

3. A nonvolatile semiconductor memory device according to claim 2, wherein said output means includes a sense amplifier for detecting the potential of the selected bit line and an output buffer for supplying output data corresponding to the detected potential, in response to the control signal of said second level.

4. A nonvolatile semiconductor memory device to claim 3, further comprising a mode terminal for receiving a test mode signal, and wherein said control means includes means responsive to said test mode signal, for generating a selection control signal prohibiting the selecting operation of said first selecting means in response to the control signal of said first level and permitting said selecting operation in response to the control signal of said second level.

5. A nonvolatile semiconductor memory device according to claim 4, wherein said mode terminal is a chip enable terminal which is selectively set at a potential of one of first, second, and third levels, and said control means includes a detecting circuit for detecting a test mode when the potential of said chip enable terminal is changed from one of the first and second levels to the third level.

6. A nonvolatile semiconductor memory device according to claim 5, wherein said detecting circuit includes first and second p-channel MOS transistors, n-channel MOS transistor, and an inverter, the current path of said second p-channel MOS transistor is connected at one end to said chip enable terminal through the current path of said first p-channel MOS transistor, and at the other end to a ground terminal through the current path of said n-channel MOS transistor, the gate of said first p-channel MOS transistor is connected to the junction of said first and second p-channel MOS transistors, the gates of said second p-channel and n-channel MOS transistors are connected to a power source terminal, and the input terminal of said inverter is connected to the junction of said second p-channel and n-channel MOS transistors.

7. A nonvolatile semiconductor memory device according to claim 5, wherein said detecting circuit includes at least two inverters connected in series, the initial inverter having an input terminal connected to said chip enable terminal and a threshold voltage higher than that of the succeeding inverter.

8. A nonvolatile semiconductor memory device according to claim 1, wherein said first selecting means includes a row decoder for decoding a row address signal and an output signal of said control means.

9. A nonvolatile semiconductor memory device according to claim 8, further comprising a plurality of dummy memory cells each formed of a programmed nonvolatile transistor which is selected when the selecting operation of first selecting means is prohibited, and a dummy word line connected to said dummy memory cells.

10. A nonvolatile semiconductor memory device according to claim 9, wherein said second selecting means includes a plurality of switching means connected in series with a load between a power terminal and said bit lines, and a column decoder for turning on one of said switching means in accordance with a column address signal.

11. A nonvolatile semiconductor memory device according to claim 1, further comprising a plurality of dummy memory cells each formed of a programmed nonvolatile transistor which is selected when the selecting operation of first selecting means is prohibited, and a dummy word line connected to said dummy memory cells.

12. A nonvolatile semiconductor memory device according to claim 1, wherein said second selecting means includes a plurality of switching means connected in series with a load between a power terminal and said bit lines, and a column decoder for turning on one of said switching means in accordance with a column address signal.

* * * * *